United States Patent
Hönigschmid

(10) Patent No.: US 6,424,563 B2
(45) Date of Patent: Jul. 23, 2002

(54) MRAM MEMORY CELL

(75) Inventor: Heinz Hönigschmid, East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/907,778

(22) Filed: Jul. 18, 2001

(30) Foreign Application Priority Data

Jul. 18, 2000 (DE) .......................................... 100 34 868

(51) Int. Cl.[7] .............................................. G11C 11/00
(52) U.S. Cl. ...................................................... 365/158
(58) Field of Search ................. 365/158, 171, 365/173

(56) References Cited

U.S. PATENT DOCUMENTS

| | | | |
|---|---|---|---|
| 5,978,257 A | 11/1999 | Zhu et al. | 365/173 |
| 6,169,687 B1 * | 1/2001 | Jonhson | 365/158 |
| 6,172,903 B1 * | 1/2001 | Nishimura | 365/158 |

FOREIGN PATENT DOCUMENTS

DE    197 44 095 A1    4/1999

OTHER PUBLICATIONS

J.M. Daughton: "Magnetic tunneling applied to memory (invited)", J. Appl. Phys., vol. 81, No. 8, Apr. 15, 1997, pp. 3758–3763.
Jo de Boeck et al: "Magnetoelectronic Devices", IEDM 99, pp. 215–218.

* cited by examiner

*Primary Examiner*—Trong Phan
(74) *Attorney, Agent, or Firm*—Laurence A. Greenberg; Werner H. Stemer; Ralph E. Locher

(57) ABSTRACT

The invention relates to an MRAM memory cell including a magnetoresistive resistor and a switching transistor. The magnetoresistive resistor is located between a central metallization plane and an upper metallization plane. The central metallization plane serves for the word line stitch and also for writing. A word line BOOST circuit is provided in the stitch region of each cell, with the result that the critical voltage is not reached in the magnetoresistive resistor and the switching transistor can nevertheless be turned on.

4 Claims, 2 Drawing Sheets

MRAM MEMORY CELL

BACKGROUND OF THE INVENTION

Field of the Invention

The present invention relates to an MRAM (Magneto-Resistive Random Access Memory) memory cell that includes a magnetoresistive resistor and a switching transistor. The magnetoresistive resistor is located between two interconnects that cross essentially perpendicularly, one interconnect of which runs in a topmost metallization plane. The source or drain, gate, and drain or source of the switching transistor are connected by interconnects in a zeroth, first, and second metallization plane, respectively. The source or drain is connected to a bit line of a memory cell array, which bit line runs in the zeroth metallization plane. The gate is connected via a word line and a stitch contact to the interconnect of the first metallization plane of the memory cell array.

MRAM memory cells are ideally embodied without any switching elements, that is to say purely as a resistor matrix in which the individual memory cells are embodied at crossover points between word lines and bit lines. In this case each memory cell includes a layer made of a hard-magnetic material, an insulating layer made, for example, of a tunnel oxide, and a soft-magnetic material. An MRAM constructed in this way is distinguished by an extremely simple structure. However, it has the disadvantage that non-negligible parasitic currents flow away in the individual memory cell arrays via the memory cells that are not addressed, specifically in the event of reading.

For this reason, for MRAMs, structures are currently being proposed, inter alia, which are based on a DRAM (Dynamic Random Access Memory) and in which switching or selection elements, such as transistors and diodes for example, are employed.

FIG. 4 illustrates a conventional MRAM cell, in which a magnetoresistive or TMR element 1 is configured between two metallization planes M3 and M2. The metallization plane M2 is connected to the source or the drain of a MOS field-effect switching transistor 2 which is provided in a semiconductor body and whose drain or source is connected to a bit line BL in a metallization plane M0. A gate conductor GC is connected to a word line WL, this preferably being done by means of a so-called stitch contact 3 to the metallization plane M1. In this case, the metallization planes M0 to M3 are configured in order above the gate conductor GC, with the result that, proceeding from the semiconductor body, the gate conductor and the metallization planes form a row GC, M0, M1, M2 and M3.

In an MRAM memory cell constructed in this way, the metallization plane M1 serves for reducing the resistance of the word line WL, which is in each case connected to the interconnect in the metallization plane M1 via the individual stitch contacts 3. The gate conductor GC of the switching transistor 2 is preferably made of doped polycrystalline silicon and extends as far as the stitch contact 3.

In order to write to the conventional memory cell shown in FIG. 4, a current of the order of magnitude of about 1 to 2 mA is required to be provided in the interconnects of the metallization planes M2 and M3. If these currents generate a unidirectional magnetic field in the magnetoresistive resistor 1, then this magnetic field determines the direction of polarization in the soft-magnetic layer, which may then be parallel or antiparallel with respect to the direction of polarization in the hard-magnetic layer. A high value of resistance is present in the case of antiparallel polarization, while parallel polarization leads to a lower value of resistance. During such a write operation, the voltage across the magnetoresistive resistor must not exceed about 0.5 V, since otherwise the insulating layer, and with it the memory cell, would be destroyed.

In order to read from the memory cell, a voltage of about 0.5 V is applied to the interconnect of the metallization plane M3 and the current flowing through the magnetoresistive resistor 1 is measured via the switching transistor 2, which is then in the on state. This current—depending on the value of resistance and thus the directions of magnetization in the soft-magnetic layer and in the hard-magnetic layer—can assume a high or low value. This measurement result is obtained on the bit line BL in the metallization plane M0.

The conventional MRAM memory cell illustrated in FIG. 4 requires a total of four metallization planes for the bit line BL (M0), the word line and word line stitch (M1) and the two interconnects which cross and between which, at their crossover point, the magnetoresistive resistor 1 is located (M2 and M3).

SUMMARY OF THE INVENTION

It is accordingly an object of the invention to provide an MRAM memory cell which overcomes the above-mentioned disadvantageous of the prior art apparatus and methods of this general type. In particular, it is an object of the invention to provide an MRAM memory cell which manages with fewer metallization planes and is thus structured significantly more simply than the existing MRAM memory cell.

With the foregoing and other objects in view there is provided, in accordance with the invention an MRAM memory cell that includes a zeroth metallization plane having an interconnect, a first metallization plane having an interconnect, and a second metallization plane having an interconnect. The second metallization plane forms a topmost metallization plane. The interconnect of the second metallization plane crosses the interconnect of the first metallization plane essentially perpendicularly. The MRAM memory cell also includes a bit line running in the zeroth metallization plane, a word line having a stitch contact connected to the interconnect of the first metalization plane, and a switching transistor having a gate connected to the interconnect of the first metalization plane by the word line and the stitch contact. The switching transistor has a source-drain path connected between the interconnect of the zeroth metallization plane and the interconnect of the second metallization plane. The source-drain path is connected to the bit line. The MRAM memory cell also includes a magnetoresistive resistor extending between the interconnect of the first metallization plane and the interconnect of the second metallization plane such that the interconnect of the first metallization plane is connected to the stitch contact of the word line and such that the magnetoresistive resistor can perform a dual function of a word line stitch and of a write line for the magnetoresistive resistor.

In accordance with an added feature of the invention, the stitch contact connects the gate of the switching transistor to the interconnect in the first metallization plane.

In accordance with an additional feature of the invention, a level shifter is provided for the gate of the switching transistor and the level shifter is located near the stitch contact.

In accordance with another feature of the invention, the level shifter is provided between the gate of the switching transistor and the stitch contact.

In the case of an MRAM memory cell of the type mentioned in the introduction, the objects are achieved in the inventive MRAM memory cell by virtue of the fact that the topmost metallization plane is the second metallization plane and the magnetoresistive resistor extends between an interconnects of the first and of the second metallization planes with the result that the interconnect of the first metallization plane is connected to the stitch contact of the word line and the magnetoresistive resistor and can thus fulfill a dual function of a word line stitch and of a write line for the magnetoresistive resistor.

The inventive MRAM memory cell is initially based on the insight that hitherto (cf. FIG. 4) the metallization plane M2 is inherently utilized only during writing, but not during the reading of the magnetoresistive resistor 1 or the memory cell thereof. In order, then, to obviate the metallization plane M2 which is required only during writing but not during reading, in the inventive MRAM memory cell, the magnetoresistive resistor 1 is relocated between the second metallization plane—serving as the upper metallization plane— and the first metallization plane. However, since the voltages are only permitted to reach about 0.5 V in the interconnects of the first metallization plane, in order to avoid destruction of the memory cell, it is necessary to provide a level shifter (BOOST circuit) for driving the selection transistor. This level shifter is preferably configured in the respective stitch regions via which the gate conductors and the word lines are connected to the interconnect of the first metallization plane.

As a result, instead of four metallization planes, the inventive MRAM memory cell now only requires three metallization planes, which constitutes a significant simplification. This simplification far outweighs the outlay required for the level shifter.

What is essential to the MRAM memory cell according to the invention, then, is that the interconnect which runs in the first metallization plane and serves for "stitching" the word line is at the same time also used as the write line for the magnetoresistive resistor. The level shifter provided in the stitch region ensures that the critical voltage exceeding 0.5 V is not reached across the magnetoresistive resistor, but that the switching transistors can nevertheless readily be turned on.

Other features which are considered as characteristic for the invention are set forth in the appended claims.

Although the invention is illustrated and described herein as embodied in a MRAM memory cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
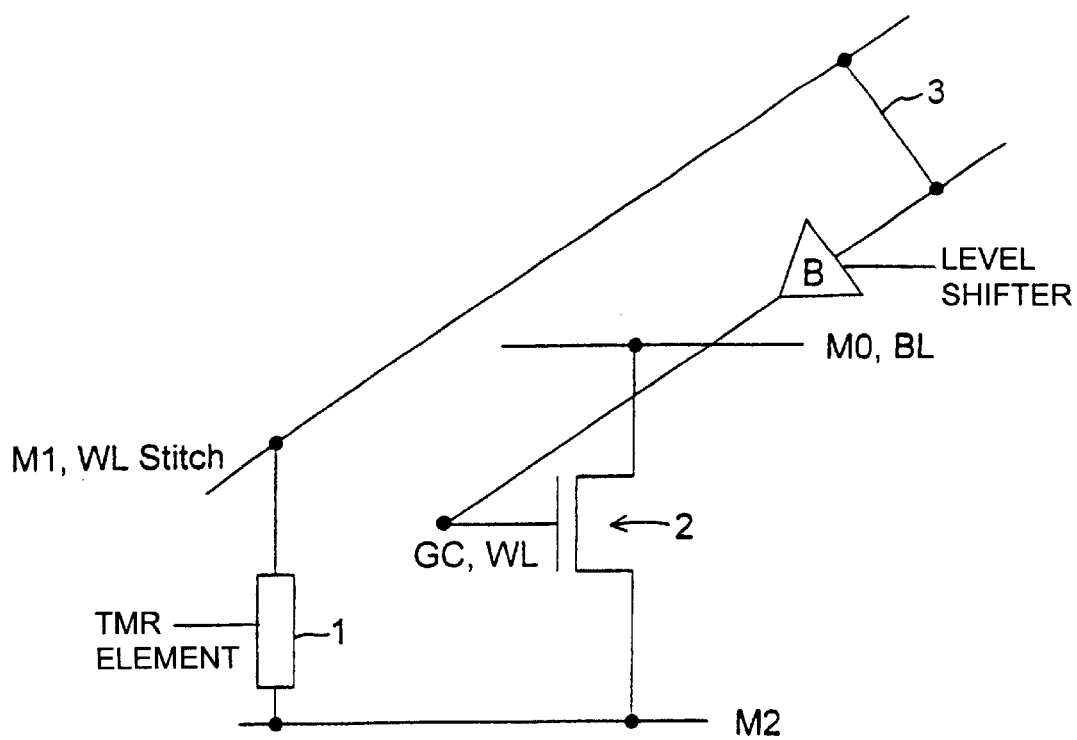
FIG. 1 shows a schematic illustration of a first exemplary embodiment of an MRAM memory cell.

Referring now to the figures of the drawing in detail and first, particularly, to FIG. 1 thereof, there is shown a magnetoresistive resistor (TMR element) 1 that is between an interconnect of an upper metallization plane M2 and an interconnect of a central metallization plane M1. The central metallization plane M1 is connected via a stitch contact 3 and a level shifter B to a gate conductor GC of a switching transistor 2, whose source-drain path is located between the interconnect of the metallization plane M2 and an interconnect—forming a bit line BL—in a lower metallization plane M0. The level shifter B is of customary design and constitutes a BOOST circuit. As in the conventional MRAM memory cell, the gate conductor GC is preferably fabricated from doped polycrystalline silicon. This gate conductor GC forms a word line WL, which is connected to the interconnect of the metallization plane M1 via the stitch contact 3.

Figure 2:
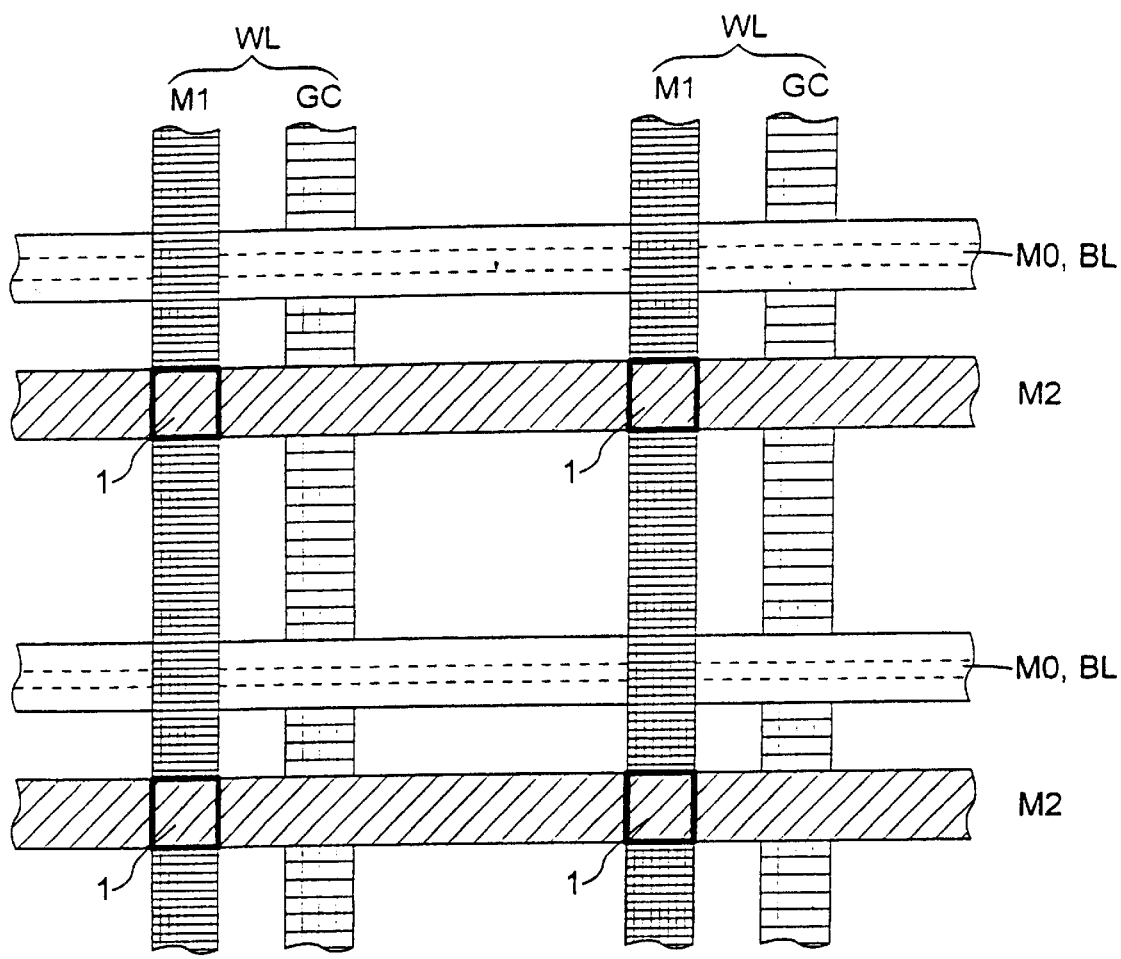
FIG. 2 shows a plan view of the arrangement of a plurality of MRAM memory cells and the metallization planes of the cells.

FIG. 2 shows, in a schematic plan view, how the interconnects in metallization planes M0, M1, M2 and the gate conductor GC may be routed with respect to one another. What is essential in this case is that the interconnects of the metallization planes M1 and M2, at whose crossover points the magnetoresistive resistors 1 or TMR elements are formed, run perpendicularly with respect to one another. The course of the interconnect of the metallization plane M0, which forms the bit line BL, is preferably configured perpendicularly to that of the interconnect of the metallization plane M1 and the gate conductor GC, which represents the word line.

Figure 3:
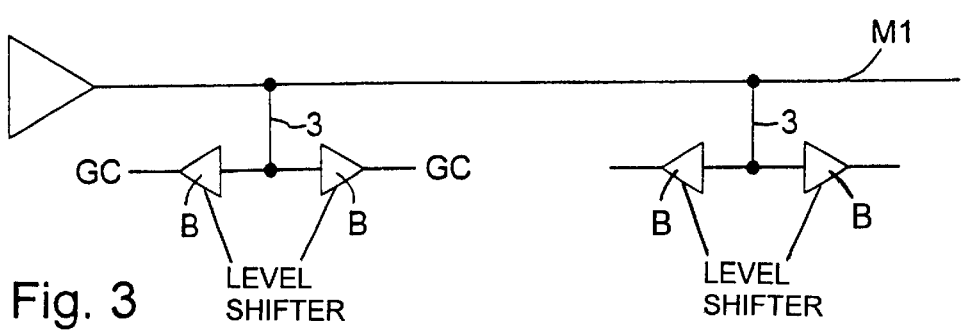
FIG. 3 shows a schematic side view of the first metallization plane in the MRAM memory cell.

FIG. 3 schematically shows, in a side view, the interconnect of the metallization plane M1 from which stitch contacts 3 are routed perpendicularly downward and are connected to the gate conductors GC of the respective switching transistors 2 via level shifters B located in the region of the stitch contacts 3.

Figure 4:
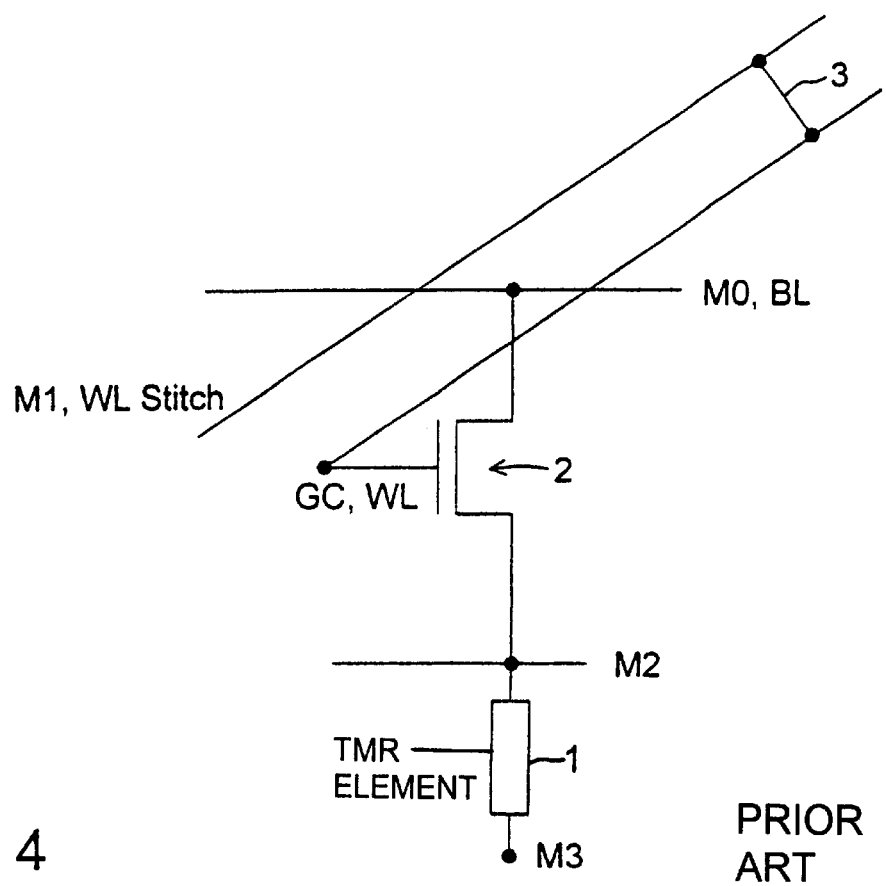
FIG. 4 shows a schematic illustration of a prior art MRAM memory cell.

For writing purposes, a current of about 1 to 2 mA is impressed between the interconnects of the metallization planes M1 and M2. The voltage present in this case should not exceed about 0.5 V since otherwise the magnetoresistive resistor 1 or the TMR element might be destroyed. As in the conventional MRAM memory cell of FIG. 4, the resistance of the magnetoresistive resistor 1 is defined by this write operation.

During a read operation, a voltage of about 0.5 V is applied to the interconnect of the metallization plane M2. The resistance of the magnetoresistive resistor 1 is then measured via the interconnect of the metallization plane M1. Since the voltage drop across the magnetoresistive resistor 1 must not exceed 0.5 V in this case, voltage amplification must be performed for the purpose of driving the switching transistor 2, this being done by the level shifter B which is inserted between the gate conductor GC of the switching transistor 2 and the stitch contact 3 in the region thereof. The level shifter B thus ensures that the critical voltage is not reached across the magnetoresistive resistor 1, but that the switching transistor 2 can nevertheless be turned on.

I claim:

1. An MRAM memory cell, comprising:
   a zeroth metallization plane having an interconnect;
   a first metallization plane having an interconnect;
   a second metallization plane having an interconnect, said second metallization plane forming a topmost metallization plane, said interconnect of said second metallization plane crossing said interconnect of said first metallization plane essentially perpendicularly;

a bit line running in said zeroth metallization plane;

a word line having a stitch contact connected to said interconnect of said first metalization plane;

a switching transistor having a gate connected to said interconnect of said first metalization plane by said word line and said stitch contact, said switching transistor having a source-drain path connected between said interconnect of said zeroth metallization plane and said interconnect of said second metallization plane, said source-drain path connected to said bit line; and a magnetoresistive resistor extending between said interconnect of said first metallization plane and said interconnect of said second metallization plane such that said interconnect of the first metallization plane is connected to said stitch contact of said word line and such that said magnetoresistive resistor can perform a dual function of a word line stitch and of a write line for said magnetoresistive resistor.

2. The MRAM memory cell according to claim 1, wherein said stitch contact connects said gate of said switching transistor to said interconnect in said first metallization plane.

3. The MRAM memory cell according to claim 2, comprising a level shifter provided for said gate of said switching transistor, said level shifter located near said stitch contact.

4. The MRAM memory cell according to claim 3, wherein said level shifter is provided between said gate of said switching transistor and said stitch contact.

* * * * *